(12) United States Patent
Iida

(10) Patent No.: US 7,437,345 B2
(45) Date of Patent: Oct. 14, 2008

(54) IMAGE REJECTION MIXER AND MULTIBAND GENERATOR

(75) Inventor: Sachio Iida, Chiba (JP)

(73) Assignee: Sony Corporation, Tokyo (JP)

( * ) Notice: Subject to any disclaimer, the term of this patent is extended or adjusted under 35 U.S.C. 154(b) by 310 days.

(21) Appl. No.: 10/946,063

(22) Filed: Sep. 22, 2004

(65) Prior Publication Data

US 2005/0159129 A1 Jul. 21, 2005

(30) Foreign Application Priority Data

Sep. 22, 2003 (JP) ............................. 2003-330363
Aug. 19, 2004 (JP) ............................. 2004-239082

(51) Int. Cl.
*G06N 5/00* (2006.01)
(52) U.S. Cl. ........................................ 706/62; 330/301
(58) Field of Classification Search ................ 455/280, 455/283, 285, 292, 293, 296, 302, 307, 324, 455/20; 333/165–167, 172; 327/551–553; 706/62; 330/301
See application file for complete search history.

(56) References Cited

U.S. PATENT DOCUMENTS

| | | | |
|---|---|---|---|
| 6,417,737 B1 * | 7/2002 | Moloudi et al. ............. | 330/301 |
| 6,608,527 B2 * | 8/2003 | Moloudi et al. ............. | 330/301 |
| 6,738,601 B1 * | 5/2004 | Rofougaran et al. ........ | 455/66.1 |
| 6,975,838 B1 * | 12/2005 | Rofougaran et al. .......... | 455/20 |
| 7,046,979 B2 * | 5/2006 | Lee ............................. | 455/302 |
| 2005/0075089 A1 * | 4/2005 | Iida ............................. | 455/285 |

* cited by examiner

*Primary Examiner*—Wilbert L Starks, Jr.
(74) *Attorney, Agent, or Firm*—Oblon, Spivak, McClelland, Maier & Neustadt, P.C.

(57) ABSTRACT

The present invention suppresses a harmonic component without impairing the phase orthogonality of a pair of complex signals. A polyphase filter is configured so that K pieces of filter circuits, each of which comprises a resistor and a capacitor, are connected and +360/K degrees out of phase with a preceding one. Since counterclockwise rotation occurs when expression is given in terms of the complex plane, a notch occurs in a negative frequency region. A RC value is set so that a notch occurs in a specified frequency band to suppress a (4N+1)-order harmonic component. Since the polyphase filter has a symmetrical structure, an unbalanced component contained in an input signal is eliminated at a frequency that agrees with a pole determined by the RC value. This action improves the orthogonality.

9 Claims, 15 Drawing Sheets

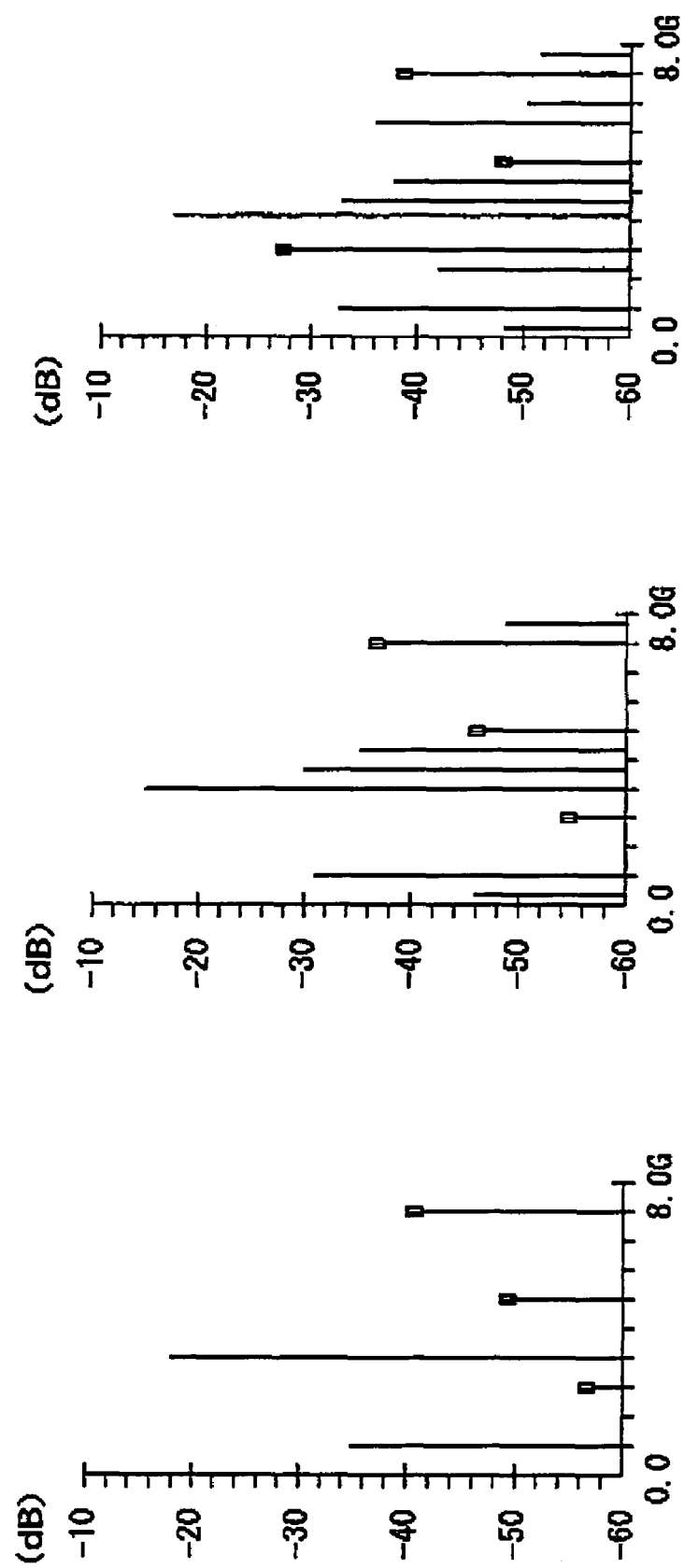

F I G. 1 5
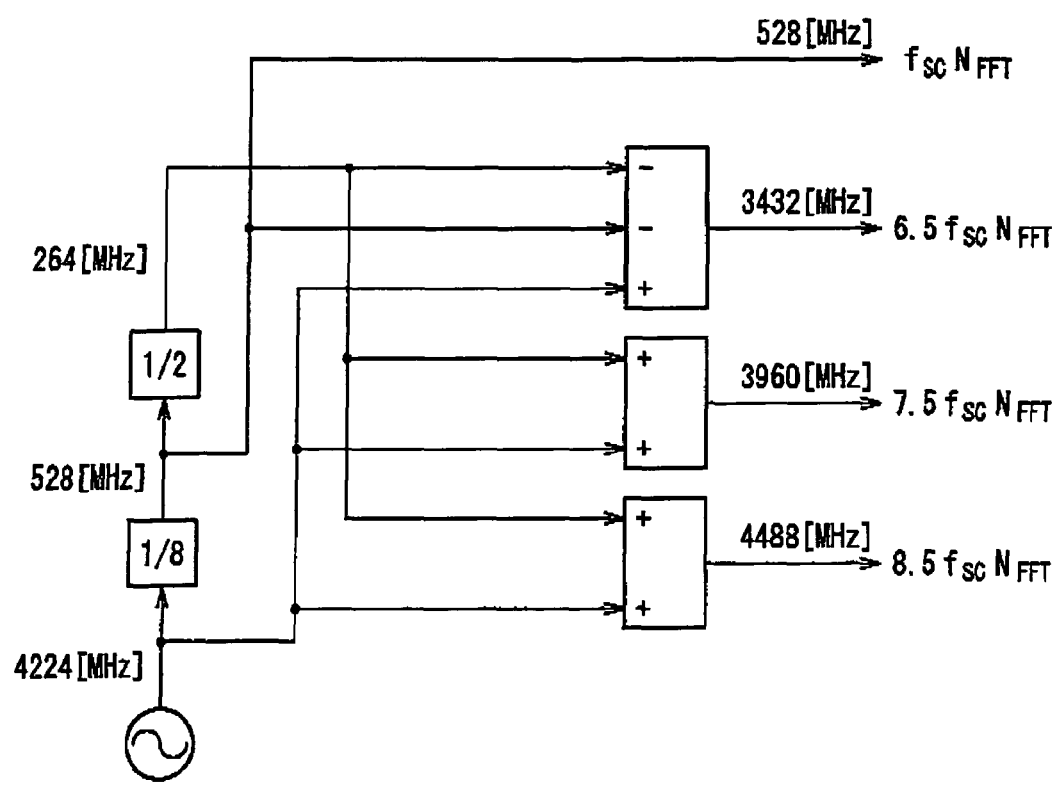

IMAGE REJECTION MIXER AND MULTIBAND GENERATOR

BACKGROUND OF THE INVENTION

1. Field of the Invention

The present invention relates to an image rejection mixer that acquires a third signal, which is a single sideband signal, by subjecting a first pair of complex signals, which are 90 degrees out of phase with each other, and a second pair of complex signals, which are 90 degrees out of phase with each other, to analog multiplication, and more particularly to an image rejection mixer that uses a 90-degree phase shifter, which doubles as a frequency divider, to acquire a pair of complex signals, which are 90 degrees out of phase with each other.

More specifically, the present invention relates to an image rejection mixer that suppresses an odd-order harmonic component contained in a pair of complex signals, and more particularly to an image rejection mixer that suppresses a harmonic component without impairing the phase orthogonality of a pair of complex signals.

2. Description of Related Art

A wireless LAN is highlighted as a system that saves the user the bother of making a hard-wired LAN connection. The use of a wireless LAN eliminates the need for most of hard-wired cable connections in an office or other work space. Therefore, a personal computer (PC) and other communication terminal can be relocated with relative ease. In recent years, the demand for a wireless LAN system has remarkably increased due, for instance, the availability of a high-speed, low-priced wireless LAN system. In addition, the introduction of a personal area network (PAN) for information communication has recently been studied with a view toward establishing a small-scale wireless network for a plurality of electronic devices around human beings. For example, various wireless communication systems and devices, which use a 2.4 GHz band, 5 GHz band, or other frequency band that does not require authorization from the supervisory authorities, are stipulated.

Recently, an ultra-wideband (UWB) communication system, which wirelessly convey information that is placed on an extremely feeble impulse train, is highlighted as a wireless communication system that provides short-distance, ultra-high-speed information conveyance, and expectations are running high for the commercialization of such a system. As an access control method for ultra-wideband communication, a data transmission system for a packet structure containing a preamble is now defined, for instance, by the IEEE802.15.3 standard.

If a wireless network is established in an indoor work environment where many devices exist together, it is conceivable that communication stations may be scattered to establish a plurality of networks one above the other. When a wireless network based on a single channel is used, there is no workaround if the ongoing communication is interrupted by another system or if the communication quality is degraded, for instance, by interference. To avoid such a problem, a multichannel communication system is used. In the multichannel communication system, which is provided with a plurality of frequency channels, one frequency channel is used for operations. If the communication quality is degraded, for instance, by interference, the ongoing network operation is maintained by means of frequency hopping in order to permit coexistence with the other networks.

When a wireless network is established indoors, a multipath environment is formed so that the employed receiver receives a combination of a direct wave and a plurality of reflected/delayed waves. Because of such a multipath environment, delay distortion (or frequency-selective fading) occurs, thereby causing an error in communications. As a result, intersymbol interference arises out of delay distortion.

For example, a multicarrier transmission method may be used to solve the above delay distortion problem. When outgoing data is to be transmitted through the use of the multicarrier transmission method, it is distributed to a plurality of carriers that differ in frequency. The band of each carrier then turns out to be a narrowband so that the data is not likely to be affected by frequency-selective fading.

In OFDM (Orthogonal Frequency Division Multiplexing), which is a typical multicarrier transmission method, the frequencies of carriers are set so that the carriers within a symbol period are orthogonal with respect to each other. When information is to be conveyed, serially transmitted information is subjected to serial/parallel conversion at symbol intervals, which are slower than the information transmission rate. A plurality of resulting output data are assigned to the carriers. The carriers are individually subjected to amplitude modulation and phase modulation. The resulting carriers are then subjected to an inverse FFT. As a result, the carriers are converted to time axis signals while the frequency axis orthogonalities of the carriers are maintained. For reception, the above operation is reversed. More specifically, an FFT is performed to convert the time axis signal to a frequency axis signal. Each carrier is demodulated in a manner appropriate for the employed modulation method. Finally, parallel/serial conversion is effected to reproduce the original information that was transmitted with a serial signal.

For example, the OFDM modulation method is adopted by the IEEE802.11a/g as a wireless LAN standard. Further, the IEEE802.15.3 working group is now engaged in the standardization of a UWB communication method that employs the OFDM modulation method, in addition to a DS-UWB method, which provides the maximum diffusion velocity for a DS information signal, and an impulse-UWB method, which transmits/receives an information signal made of impulse signal trains that are timed at intervals as short as several hundred picoseconds or so. As regards the OFDM-UWB communication method, an OFDM modulation method for performing frequency hopping (FH) for a 3.1-4.8 GHz frequency band with three 528 MHz wide subbands and using an IFFT/FFT having 128-point frequency bands is being studied (refer to Nonpatent Document 1).

The use of a multiband generator is required for frequency hopping. A high-precision multiband generator can be formed if it comprises a plurality of oscillators for generating their respective frequency bands. However, the use of such a multiband generator causes problems in terms of circuit area and power consumption. Therefore, there is a technical demand that a single oscillator perform frequency division to generate a plurality of frequency bands.

For example, multiband generation can be achieved by repeatedly frequency-dividing a single frequency generated from an oscillator and mixing the resulting frequency-divided outputs (that is, by outputting the sum of the frequencies or the difference between the frequencies).

FIG. 15 illustrates a frequency synthesis block (3-band mode) for hopping for use with a multiband OFDM system. As indicated in the figure, the signal center frequency can be synthesized (by frequency addition/subtraction) from a single oscillator (e.g., TCXO (temperature-compensated crystal oscillator)) by means of frequency division and mixing. Further, synthesis can also be accomplished by means of 528 MHz frequency division, which is required as a sample clock.

In the example shown in FIG. 15, ⅛ frequency division is first performed to derive a frequency of 528 MHz from a frequency of 4224 MHz, which is generated from the oscillator. A frequency of 264 MHz is then obtained by performing ½ frequency division.

Next, each mixer obtains a frequency of 4488 MHz by adding a frequency of 4224 MHz to a frequency of 264 MHz. Further, each mixer obtains a frequency of 3960 MHz by adding a frequency of 4224 MHz to a frequency of 264 MHz. Furthermore, each mixer obtains a frequency of 3422 MHz by subtracting a frequency of 528 MHz and a frequency of 264 MHz from a frequency of 4224 MHz.

An image rejection mixer can be used as a device for frequency addition or subtraction, that is, for mixing. FIG. 16 schematically illustrates the configuration of an image rejection mixer. The basic principle of the image rejection mixer will now be described with reference to FIG. 16. The reference numerals S104a and S104b denote LO signals that are orthogonal with respect to each other. The reference numerals S102a and S102b denote IF signal that are orthogonal with respect to each other. The reference numeral S103c denotes an RF signal. The following equations represent the LO signals:

$$S104a = \cos(\omega_{lo} \cdot t) \quad (1)$$

$$S104b = \sin(\omega_{lo} \cdot t) \quad (2)$$

The following equations represent the IF signals:

$$S102a = \cos(\omega_{if} \cdot t) \quad (3)$$

$$S102b = -\sin(\omega_{if} \cdot t) \quad (4)$$

In a first multiplier 103, signals S104a and S102a are multiplied together. In a second multiplier, signals S104b and S102b are multiplied together. In an adder 103c, the product of the second multiplier is subtracted from the product of the first multiplier. As a result, the RF signal S103c is expressed by Equation 5 below:

$$S103c = \cos(\omega_{lo} \cdot t) \cdot \cos(\omega_{if} \cdot t) - (-\sin(\omega_{lo} \cdot t) \cdot \sin(\omega_{if} \cdot t)) \quad (5)$$

Synthesis can be achieved by performing frequency addition/subtraction in accordance with the trigonometric addition theorem. Therefore, Equation 6 below can be obtained by modifying Equation 5 above.

$$S103c = \cos\lfloor(\omega_{lo} - \omega_{if}) \cdot t\rfloor \quad (6)$$

Consequently, the RF signal of a frequency obtained by subtracting the IF signal frequency from the DO signal frequency is output. The frequency component of an image, which is obtained by adding the LO signal frequency to the IF signal frequency, is not generated. This is the reason why the mixer is called an image rejection mixer. LO signals orthogonal with respect to each other and IF signals orthogonal with respect to each other are required for the configuration of an image rejection mixer.

FIG. 17 shows an example in which a frequency divider is used as a 90-degree phase shifter for acquiring IF signals that are orthogonal with respect to each other. For present-day cellular phones, a frequency divider is generally used as a 90-degree phase shifter. When LO and IF signals are generated from a common oscillator by means of frequency division, an advantage is provided because the number of employed 90-degree phase shifters and frequency synthesizers can be reduced (refer, for instance, to Patent Documents 1 and 2).

A master-slave D-latch shown in FIG. 18 is used as a frequency divider circuit. The reference numeral S101 denotes a differential input. The reference numerals S101a and S101b denote differential outputs. Two different phase relationships may exist between the input and output depending on the D-latch initial status. However, the phase relationship between signals S101a and S101b remains unchanged without regard to the phase relationship between the input and output. FIG. 19 shows input/output waveforms prevailing in either of the above-mentioned relationships. As indicated in the figure, signals S101a and S101b are subjected to ½ frequency division with respect to signal S101. The output waveform is a rectangular wave. It is expressed as the sum of a fundamental wave and odd-order harmonic as indicated in Equations 7 and 8 below. At each frequency, signals S101a and S101b are 90 degrees out of phase with each other.

$$S101a = \sum_{n=1}^{\infty} \frac{\sin(n \cdot \frac{\pi}{2})}{n} \cdot \cos(\sin(n \cdot \frac{\pi}{2}) \cdot n \cdot \omega_{if} \cdot t) \quad (7)$$

$$= -\sum_{n=1}^{\infty} \frac{\sin(n \cdot \frac{\pi}{2})}{n} \cdot \sin(\sin(n \cdot \frac{\pi}{2}) \cdot n \cdot \omega_{if} \cdot t + \frac{\pi}{2})$$

$$S101b = -\sum_{n=1}^{\infty} \frac{\sin(n \cdot \frac{\pi}{2})}{n} \cdot \sin(\sin(n \cdot \frac{\pi}{2}) \cdot n \cdot \omega_{if} \cdot t) \quad (8)$$

Determining the sum of sine waves causes no problem. However, when frequency division is repeated, spurious products, which are impurities made of an odd-order harmonic, are contained in the output. The following explanation deals with the spurious products that are contained in the output when the output of a 90-degree phase shifter is directly applied to the image rejection mixer as an IF signal.

The two signals that are 90 degrees out of phase with each other can be handled together when a complex signal is used. When signal S101a is assigned to the real part of the complex signal with signal S101b assigned to the imaginary part, Equation 9 below is obtained from Equations 7 and 8 above:

$$S101a + j \cdot S101b = \left(\sum_{n=1}^{\infty} \frac{\sin(n \cdot \frac{\pi}{2})}{n} \cdot \exp(-j \cdot \sin(n \cdot \frac{\pi}{2}) \cdot n \cdot \omega_{if} \cdot t)\right) \quad (9)$$

When Equation 9 above is expanded to a fifth-order harmonic for simplification, Equation 10 below is obtained:

$$S101a + j \cdot S101b = \exp(-j \cdot \omega_{if} \cdot t) - \frac{1}{3}\exp(j \cdot 3 \cdot \omega_{if} \cdot t) + \frac{1}{5}\exp(-j \cdot 5 \cdot \omega_{if} \cdot t) \quad (10)$$

Likewise, if it is assumed that the LO signals are fundamental waves only, Equation 11 below is obtained:

$$S104a + j \cdot S104b = \exp(j \cdot \omega_{lo} \cdot t) \quad (11)$$

As the output of the image rejection mixer, only the real part of the product of Equations 10 and 11 above is expressed as signal S103c as indicated by Equation 12 below. Equation 12 can be simplified to obtain Equation 13.

$$S103c = \text{Re}\left[\exp[j \cdot (\omega_{lo} - \omega_{if}) \cdot t] - \right. \quad (12)$$
$$\frac{1}{3} \cdot \exp[j \cdot (\omega_{lo} + 3 \cdot \omega_{if}) \cdot t] +$$
$$\left. \frac{1}{5} \cdot \exp[j \cdot (\omega_{lo} - 5 \cdot \omega_{if}) \cdot t]\right]$$

$$S103c = \cos[(\omega_{lo} - \omega_{if}) \cdot t] - \quad (13)$$
$$\frac{1}{3} \cdot \cos[(\omega_{lo} + 3 \cdot \omega_{if}) \cdot t] +$$
$$\frac{1}{5} \cdot \cos[(\omega_{lo} - 5 \cdot \omega_{if}) \cdot t]$$

If, for instance, the LO signals are 1056 MHz and the IF signals are 264 MHz, the resulting RF signal output is as indicated in the table below:

TABLE 1

| RF frequency generation formula | $\omega_{lo} - \omega_{if}$ | $\omega_{lo} + 3\omega_{if}$ | $\omega_{lo} - 5\omega_{if}$ |
|---|---|---|---|
| RF signal frequency [MHz] | 792 | 1848 | 264 |
| RF signal level | 1 | 1/3 | 1/5 |
| RF signal relative level [dB] | 0 | −9.5 | −14.0 |

It is well to remember that the discussion is simplified by dealing with the IF signal harmonic only. When the LO signal harmonic is also taken into consideration, it is obvious that spurious products arise in various combinations. In the above table, $\omega_{lo} - 5\omega_{if}$ is a negative frequency. However, $\cos(\omega t) = \cos(-\omega t)$. As far as real number signals are concerned, there is no distinction between positive and negative frequencies. Therefore, the RF signal is a positive frequency.

As is obvious from Table 1, the output RF signal is not limited to 792 MHz. Table 1 indicates that frequencies of 1848 MHz and 264 MHz are generated as spurious products at relatively great relative levels of −9.5 dB and −14 dB, respectively. The relative levels are equal to the harmonic level with respect to the IF signal fundamental wave. Therefore, the IF signal harmonic needs to be reduced for the purpose of reducing the spurious products contained in the RF signal.

In wireless communications, the available frequency spectrum is generally limited by the Radio Law and the spurious products need to be suppressed. In a conventional example, a bandpass filter 107 is additionally positioned subsequently to the image rejection mixer as indicated in FIG. 17 or lowpass filters 105, 106 are positioned between a 90-degree phase shifter 101 and multipliers 103a, 103b as indicated in FIG. 20 (refer, for instance, to Patent Document 3).

However, the use of a bandpass filter causes a problem where the parts cost and size both increase. If the amount of harmonic suppression is increased during the use of lowpass filters, the circuit scale increases, thereby increasing the power consumption. If a resistor and capacitor are mounted in a semiconductor circuit, the resistance and capacitance values generally contain an individual difference of approximately 15%. However, if the two lowpass filters differ in the amplitude characteristic or phase characteristic, the IF signal orthogonality deteriorates, thereby degrading the image rejection performance.

[Patent Document 1]
Japanese Patent JP-A No. 4437/1998

[Patent Document 2]
Japanese Patent JP-B No. 29089/1999

[Patent Document 3]
Japanese Patent JP-A No. 171296/2002

[Nonpatent Document 1]
IEEE802.15.3a TI Document <URL: http://grouper.ieee.org/groups/802/15/pub/2003/May03 filename: 03142r2P802-15_TI-CFP-Document.doc>

SUMMARY OF THE INVENTION

An object of the present invention is to provide an excellent image rejection mixer that is capable of acquiring a third signal, which is a single sideband signal, by subjecting a first pair of complex signals, which are 90 degrees out of phase with each other, and a second pair of complex signals, which are 90 degrees out of phase with each other, to analog multiplication.

Another object of the present invention is to provide an excellent image rejection mixer that is capable of acquiring a pair of complex signals, which are 90 degrees out of phase with each other, by using a 90-degree phase shifter that doubles as a frequency divider.

Yet another object of the invention is to provide an excellent image rejection mixer that is capable of optimally suppressing an odd-order harmonic component contained in a pair of complex signals.

Still another object of the present invention is to provide an excellent image rejection mixer that is capable of suppressing a harmonic component without impairing the phase orthogonality of a pair of complex signals.

The present invention has been made in view of the above circumstances. In a first aspect of the present invention, an image rejection mixer acquires a third signal, which is a single sideband signal, by subjecting a first pair of complex signals, which are 90 degrees out of phase with each other, and a second pair of complex signals, which are 90 degrees out of phase with each other, to analog multiplication. The image rejection mixer comprises harmonic component suppression means for suppressing a (4N+1)-order harmonic component (where N is an integer) that is contained in the first pair of complex signals, which are 90 degrees out of phase with each other, or the second pair of complex signals, which are 90 degrees out of phase with each other.

The harmonic component suppression means comprises a positive-phase polyphase filter that is formed by cascading K pieces of filter circuits in which a resistor and a capacitor are connected in parallel. The filter circuits are +360/K degrees out of phase with a preceding one.

When the K-phase voltage is expressed in terms of the complex plane, counterclockwise rotation occurs in the above instance. For a polyphase filter, therefore, a notch arises in a negative frequency region. When the RC value of each filter circuit is set so that a notch occurs in a frequency band for a (4N+1)-order harmonic component, a desired harmonic component suppression effect is obtained. Here, the RC value represents a time constant. Strictly speaking, the angular frequency is $1/(CR)$ and the frequency is $1/(2\pi CR)$. Since the polyphase filter structure is symmetrical, an unbalanced component contained in the input signal is eliminated at a frequency that is substantially equal to the pole frequency $fp=1/(2\pi CR)$. This action improves the orthogonality.

In a second aspect of the present invention, an image rejection mixer acquires a third signal, which is a single sideband signal, by subjecting a first pair of complex signals, which are 90 degrees out of phase with each other, and a second pair of complex signals, which are 90 degrees out of phase with each other, to analog multiplication. The image rejection mixer comprises harmonic component suppression means for suppressing a (4N−1)-order harmonic component (where N is an integer) that is contained in the first pair of complex signals, which are 90 degrees out of phase with each other, or the second pair of complex signals, which are 90 degrees out of phase with each other.

The harmonic component suppression means comprises a negative-phase polyphase filter that is formed by cascading K pieces of filter circuits in which a resistor and a capacitor are connected in parallel. The filter circuits are −360/K degrees out of phase with a preceding one.

When the K-phase voltage is expressed in terms of the complex plane, clockwise rotation occurs in the above instance. For a polyphase filter, therefore, a notch arises in a positive frequency region. When the RC value of each filter circuit is set so that a notch occurs in a frequency band for a (4N−1)-order harmonic component, a desired harmonic component suppression effect is obtained. Here, the RC value represents a time constant, Strictly speaking, the angular frequency is 1/(CR) and the frequency is 1/(2πCR). Since the polyphase filter structure is symmetrical, an unbalanced component contained in the input signal is eliminated at a frequency that is substantially equal to the pole frequency fp=1/(2πCR). This action improves the orthogonality.

When the image rejection mixer according to the first aspect of the present invention is cascaded with the image rejection mixer according to the second aspect of the present invention, it is possible to optimally suppress any odd-order harmonic component.

The present invention provides an image rejection mixer that is capable of suppressing a harmonic component without impairing the phase orthogonality of a pair of complex signals.

The present invention permits a polyphase filter to suppress a (4N−1)-order harmonic and (4N+1)-order harmonic that are contained in an orthogonal rectangular wave generated by a 90-degree phase shifter. Therefore, a large amount of harmonic suppression is attained although the employed configuration is simple. As a result, the present invention provides an image rejection mixer that reduces the amount of spurious products.

The present invention can improve the orthogonality by allowing an orthogonal rectangular wave generated by a 90-degree phase shifter to pass through a polyphase filter. Therefore, the present invention provides an image rejection mixer that delivers improved image rejection performance.

Other objects, features, and advantages of the present invention will become apparent from the following detailed description of the preferred embodiments of the present invention and from the accompanying drawings.

BRIEF DESCRIPTION OF THE DRAWINGS

FIG. 14 shows the output spectrums of a multiband generator that is shown in FIG. 13.

FIG. 15 illustrates a frequency synthesis block for hopping, which is used in a multiband OFDM system.

DETAILED DESCRIPTION OF THE PREFERRED EMBODIMENTS

Embodiments of the present invention will now be described in detail with reference to the accompanying drawings.

Figure 1:
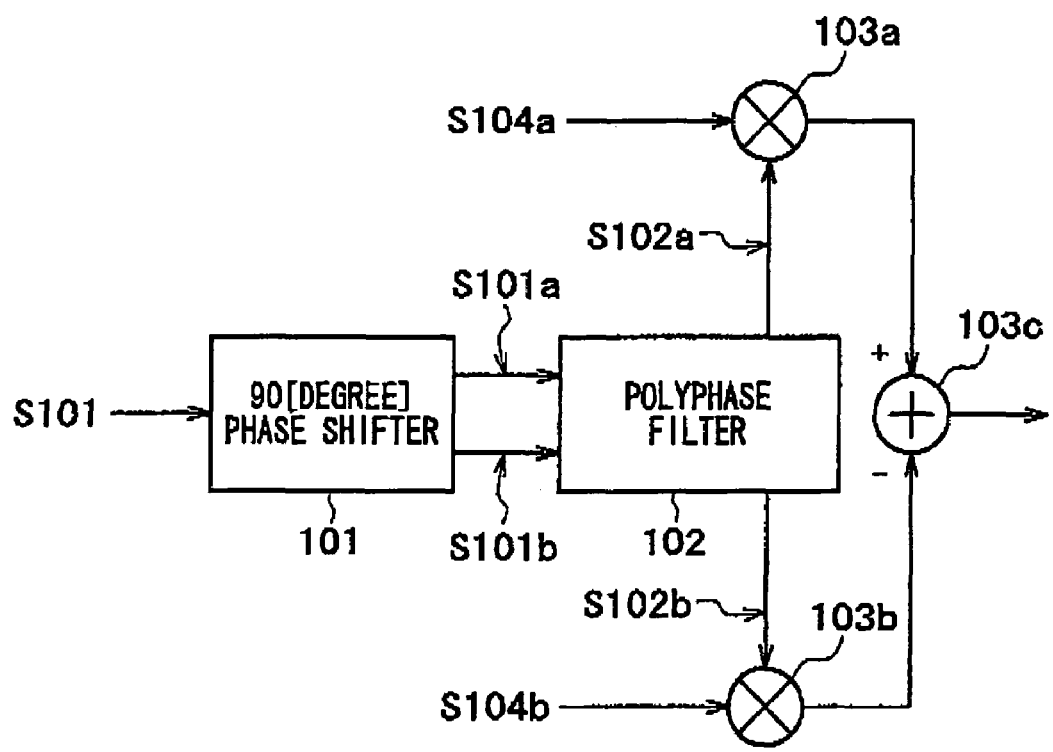
FIG. 1 illustrates the principle of one embodiment of an image rejection mixer according to the present invention.

FIG. 1 illustrates the principle of one embodiment of an image rejection mixer according to the present invention. The operation of the image rejection mixer will now be described with reference to FIG. 1.

Signal S101, which has two times the frequency of an IF signal, enters a 90-degree phase shifter 101, which doubles as a frequency divider. IF signals S101a and S101b, which are 90 degrees out of phase with each other, are then output. The resulting output waveform is the sum of a fundamental wave and odd-order harmonic as indicated in Equations 7 and 8 above.

Signals S101a and S101b, which are 90 degrees out of phase with each other, enter a polyphase filter 102. Signals S102a and S102b are then output with an odd-order harmonic component suppressed.

On the other hand, signals S104a and S104b are LO signals, which are paired orthogonal complex signals indicated in Equations 1 and 2 above. In a first multiplier 103a, signals S104a and S102a, which are paired with another signal to make a pair, are multiplied together. In a second multiplier 103b, signals S104b and S102b, which are the remaining signals of a pair, are multiplied together. In an adder 103c, the product of the second multiplier 103b is subtracted from the product of the first multiplier 103a, and the result is output as frequency-synthesized RF signal S103c.

For details of the polyphase filter, reference should be made, for instance, to U.S. Pat. No. 3,559,042 and "Single Sideband Modulation using Sequence Asymmetric Polyphase Networks" by M. J. Gingell (Electrical Communication, vol. 48, no. 1-2, pp. 21-25, 1973).

A polyphase filter with four phases for use with the present invention will now be described.

Figure 2:
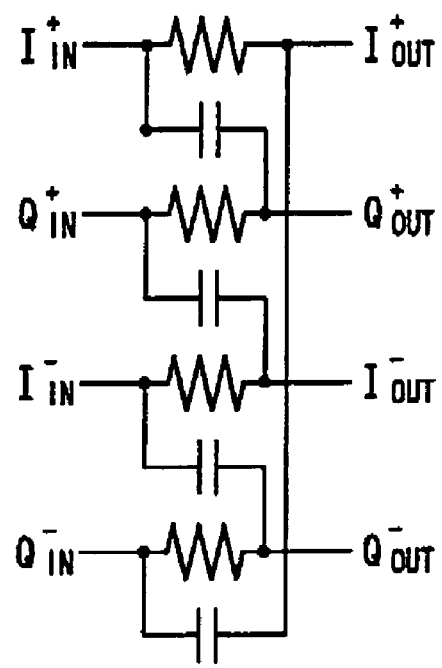
FIG. 2 illustrates the basic configuration of a polyphase filter with four phases.
Figure 3:
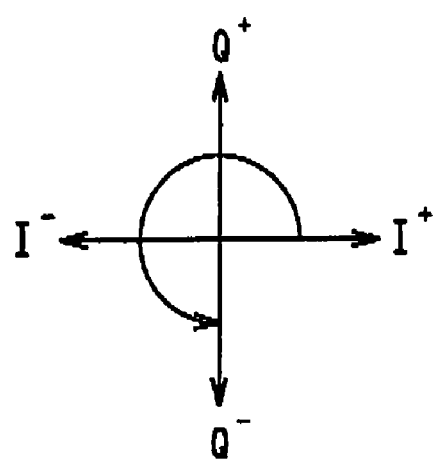
FIG. 3 illustrates the rotation direction of a complex vector sequence of a polyphase filter with four phases, which is shown in FIG. 2.

FIG. 2 illustrates the basic configuration of a polyphase filter with four phases. In the polyphase filter shown in the figure, four filter circuits in which a resistor and a capacitor are connected in parallel are cascaded. It is assumed that, from top to bottom, voltages whose phase is advanced by 90 degrees from a preceding one are input from left-hand input terminals, and that, from top to bottom, voltages whose phase is advanced by 90 degrees from a preceding one are output from right-hand output terminals. When the four phases of voltages, which are 90 degrees out of phase with each other, are expressed in terms of the complex plane by using the symbols I and Q, a complex vector sequence, in which I+, Q+, I−, and Q− are arranged in order named, is obtained. It can be illustrated counterclockwise as shown in FIG. 3. In this instance, the chain matrix of the polyphase filter is as indicated by equation 14 below:

$$(F) = \begin{pmatrix} \frac{1+j\cdot\omega\cdot C\cdot R}{1+\omega\cdot C\cdot R} & \frac{R}{1+\omega\cdot C\cdot R} \\ \frac{j\cdot 2\cdot\omega\cdot C}{1+\omega\cdot C\cdot R} & \frac{i+j\cdot\omega\cdot C\cdot R}{1+\omega\cdot C\cdot R} \end{pmatrix} \quad (14)$$

Figure 4:
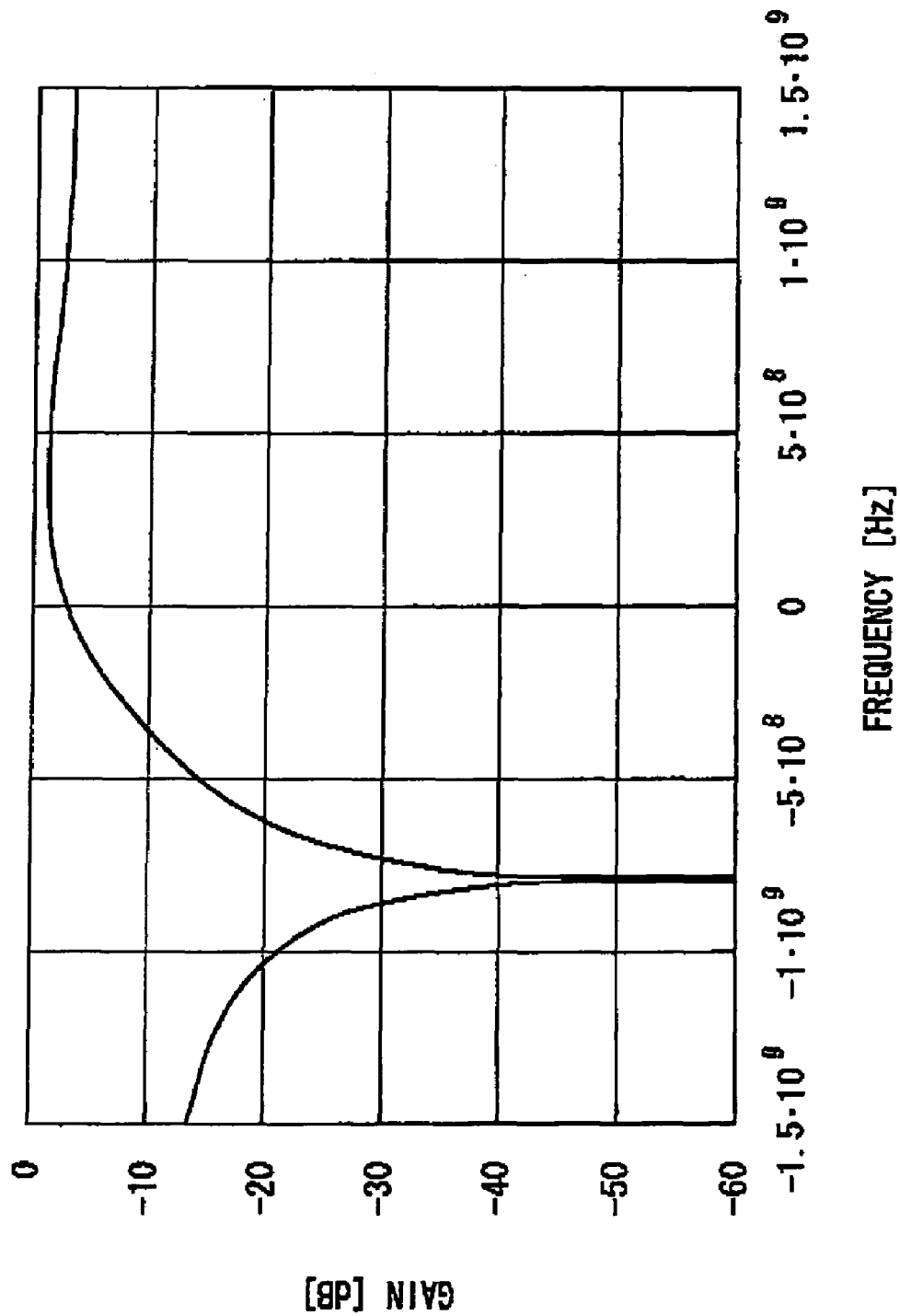
FIG. 4 illustrates the frequency response of a polyphase filter with four phases, which is shown in FIG. 2.

When a constant is substituted so that the pole frequency $1/(2\pi CR)$ determined by the RC value in Equation 14 above is 792 MHz, and the frequency response is determined in consideration of a signal source impedance and load impedance, the negative frequency is notched as shown in FIG. 4. Therefore, it is possible to suppress the fifth-order harmonic component.

Figure 5:
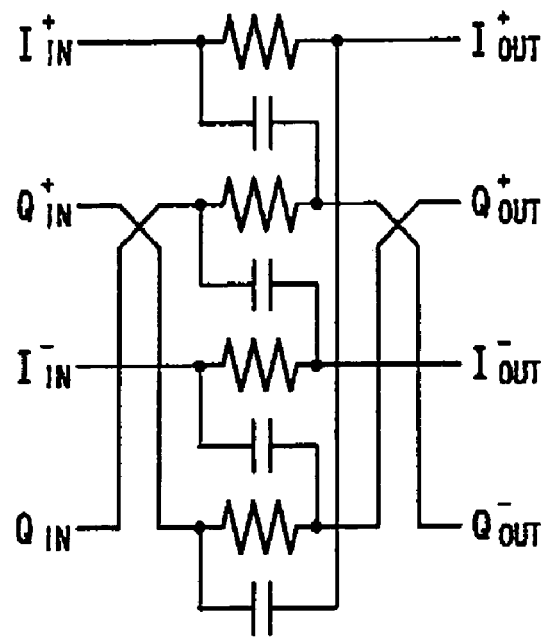
FIG. 5 illustrates the basic configuration of a polyphase filter with four negative phases.
Figure 6:
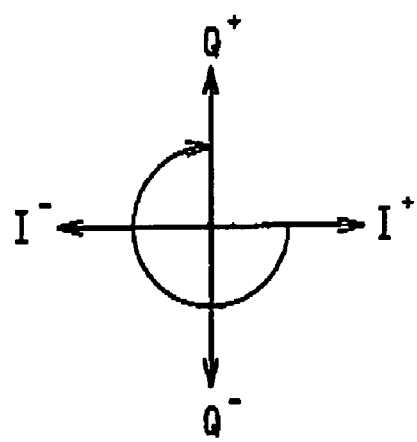
FIG. 6 illustrates the rotation direction of a complex vector sequence of a polyphase filter with four phases, which is shown in FIG. 5.

FIG. 5 shows the configuration of a polyphase filter with four negative phases. The polyphase filter shown in the figure is configured so that four filter circuits in which a resistor and a capacitor are connected in parallel are cascaded. However, the employed circuit configuration is such that the Q+ and Q− wires for the polyphase filter input/output terminals shown in FIG. 2 are interchanged. When the four phases of voltages, which are 90 degrees out of phase with each other, are expressed in terms of the complex plane by using the symbols I and Q, a complex vector sequence, in which I+, Q−, I−, and Q+ are arranged in order named, is obtained. It can be illustrated counterclockwise as shown in FIG. 6. In this instance, the chain matrix of the polyphase filter is as indicated by equation 15 below:

$$(F) = \begin{pmatrix} \frac{1-j\cdot\omega\cdot C\cdot R}{1-\omega\cdot C\cdot R} & \frac{R}{1-\omega\cdot C\cdot R} \\ \frac{-j\cdot 2\cdot\omega\cdot C}{1-\omega\cdot C\cdot R} & \frac{1-j\cdot\omega\cdot C\cdot R}{1-\omega\cdot C\cdot R} \end{pmatrix} \quad (15)$$

Figure 7:
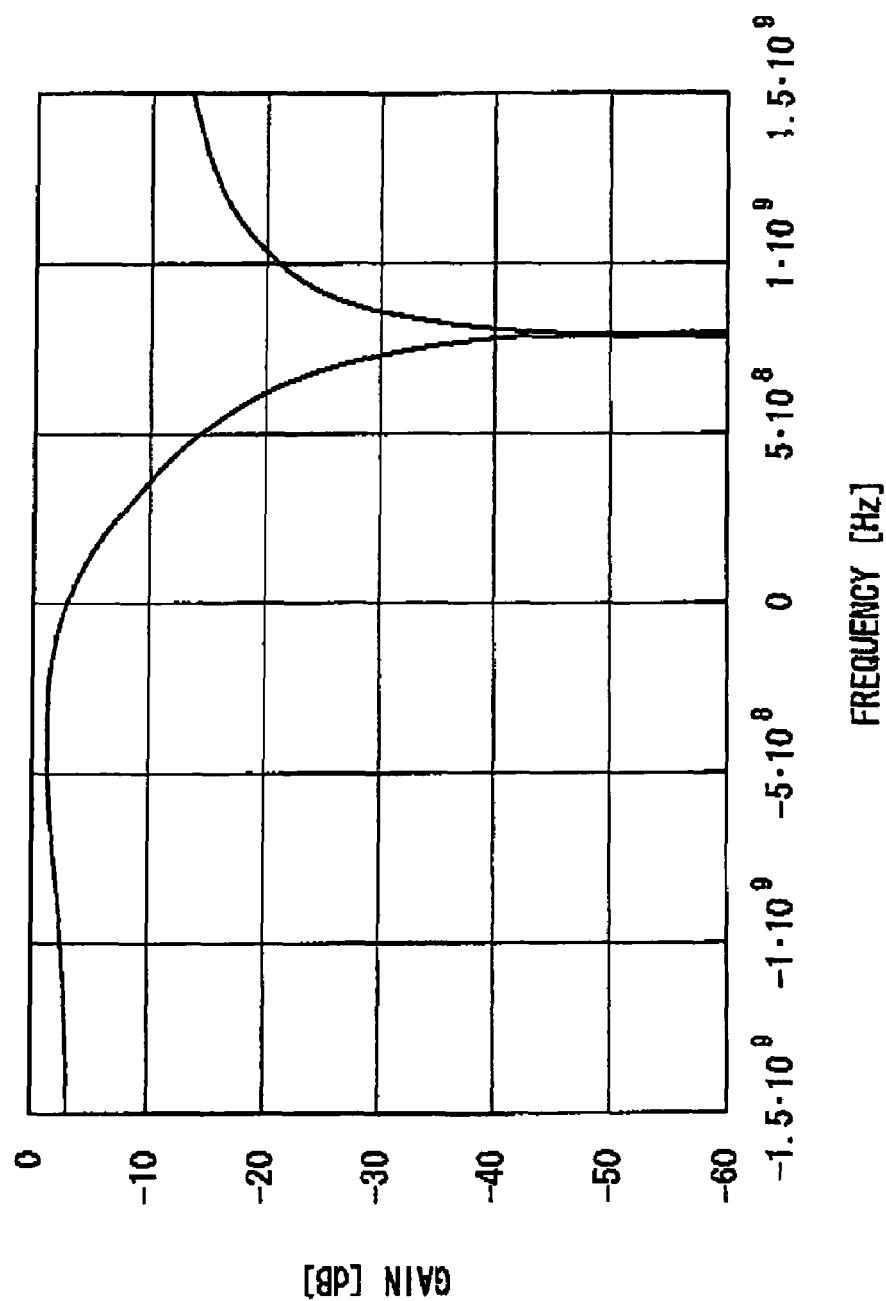
FIG. 7 illustrates the frequency response of a polyphase filter with four negative phases, which is shown in FIG. 5.

When a constant is substituted so that the pole frequency $1/(2\pi CR)$ determined by the RC value in Equation 15 is 1320 MHz, and the frequency response is determined in consideration of a signal source impedance and load impedance, the positive frequency is notched as shown in FIG. 7. Therefore, it is possible to suppress the third-order harmonic component.

Figure 8:
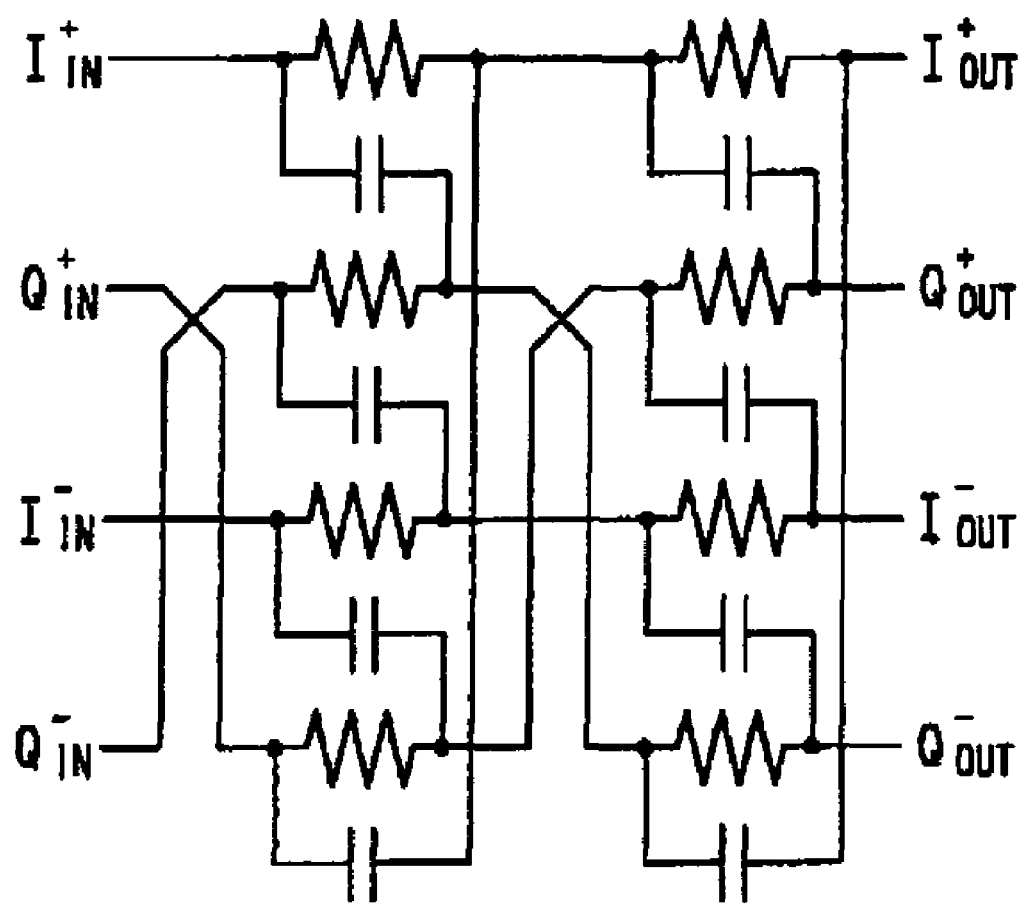
FIG. 8 illustrates the configuration of a polyphase filter that is formed by cascading a polyphase filter with four phases, which is shown in FIG. 2, and a polyphase filter with four negative phases, which is shown in FIG. 5.
Figure 9:
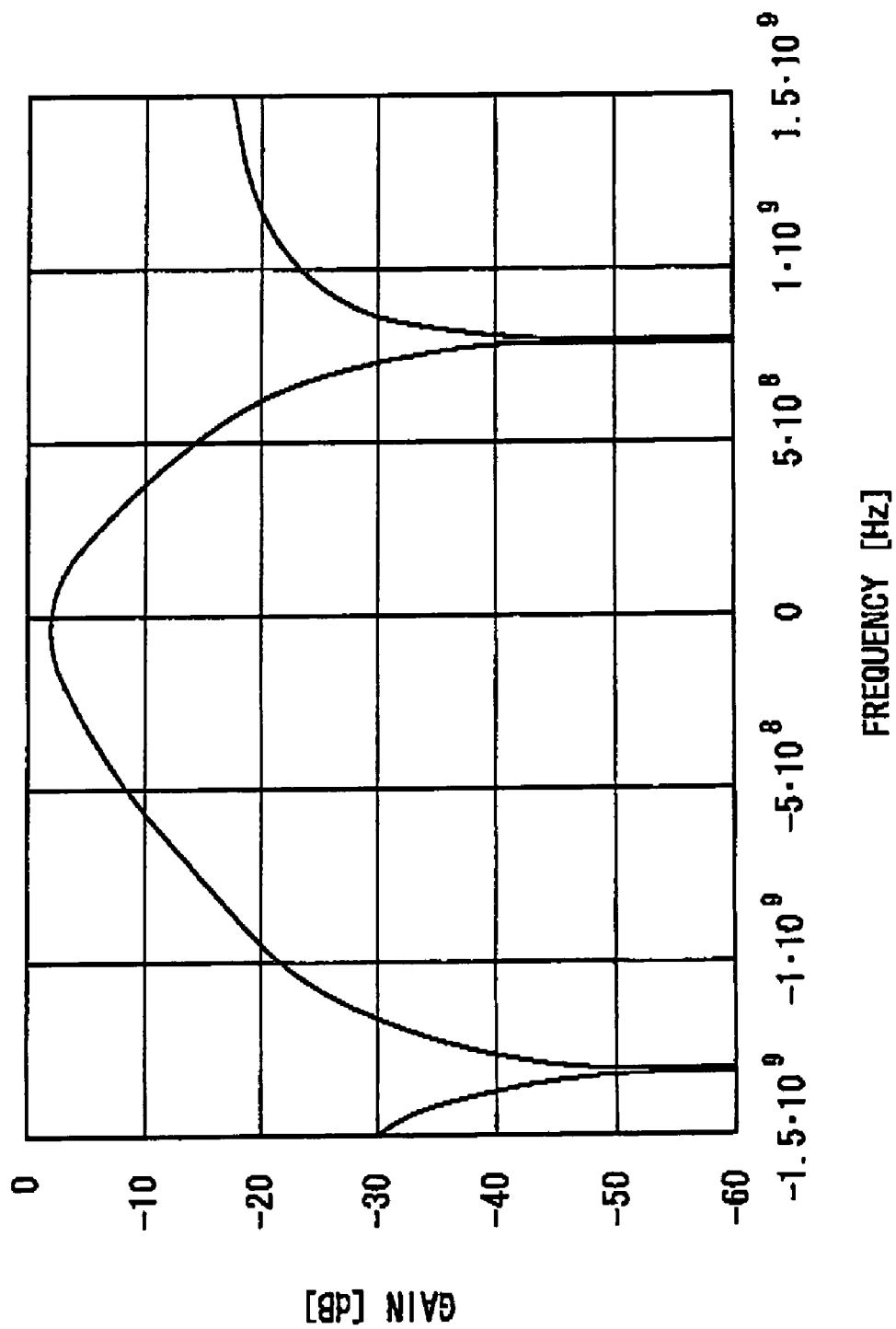
FIG. 9 illustrates the frequency response of a polyphase filter that is formed by cascading as indicated in FIG. 8.

FIG. 8 shows the configuration of a polyphase filter in which the polyphase filter with four phases in FIG. 2 and the polyphase filter with four negative phases in FIG. 5 are cascaded. As regards the polyphase filter shown in FIG. 8, the positive and negative frequencies can be both notched. When the chain matrixes indicated in Equations 14 and 15 above are cascaded and constants are substituted into Equations 14 and 15 so that the negative and positive notches are 1320 MHz and 792 MHz, respectively, it is possible to simultaneously suppress the third- and fifth-order harmonic components as shown in FIG. 9.

When a polyphase filter with four phases for which a constant is set so that the pole frequency $1/(2\pi CR)$ determined by the RC value is a $(4N+1)$-order harmonic component band and a polyphase filter with four negative phases for which a constant is set so that the pole frequency $1/(2\pi CR)$ determined by the RC value is a $(4N-1)$-order harmonic component band are cascaded to the polyphase filter shown in FIG. 8, it is possible to configure an image rejection filter that is capable of eliminating any odd-order harmonic component.

When Equation 9 above, which expresses outputs S101$a$ and S101$b$ of the 90-degree phase shifter in FIG. 1 as complex signals, is expanded and rearranged according to the harmonic order, Equation 16 below is obtained. It is well to remember that the symbol N represents a natural number.

$$S101a + j\cdot S101b = \exp(-j\cdot\omega_{if}\cdot t) - \frac{\exp[j\cdot(4\cdot N-1)\cdot\omega_{if}\cdot t]}{4\cdot N-1} + \frac{\exp[-j\cdot(4\cdot N+1)\cdot\omega_{if}\cdot t]}{4\cdot N+1} \quad (16)$$

Figure 10:
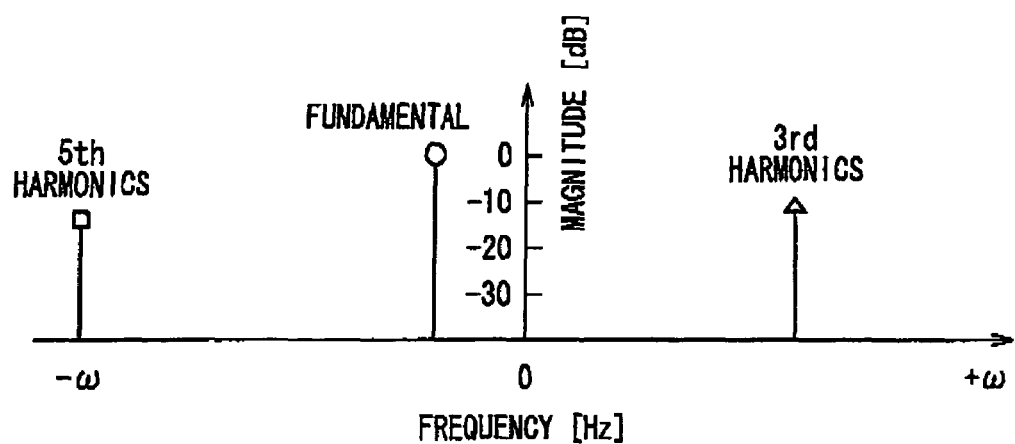
FIG. 10 shows the frequency spectrum of a rectangular complex signal.
Figure 11:
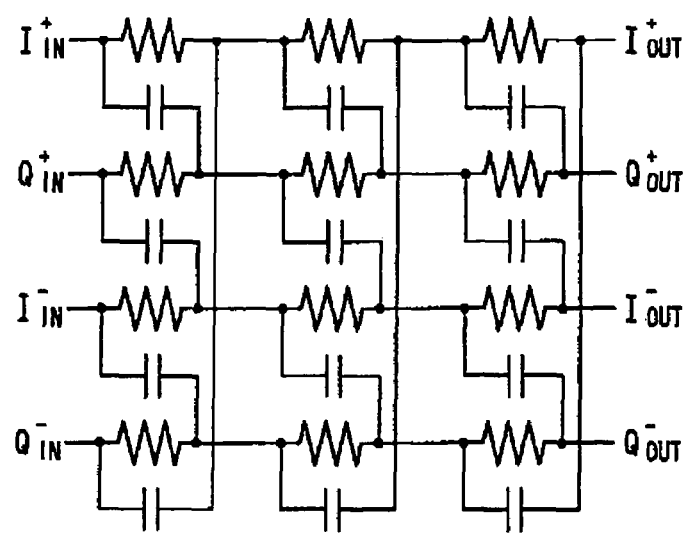
FIG. 11 shows a typical configuration of a polyphase filter that is formed by cascading.
Figure 12:
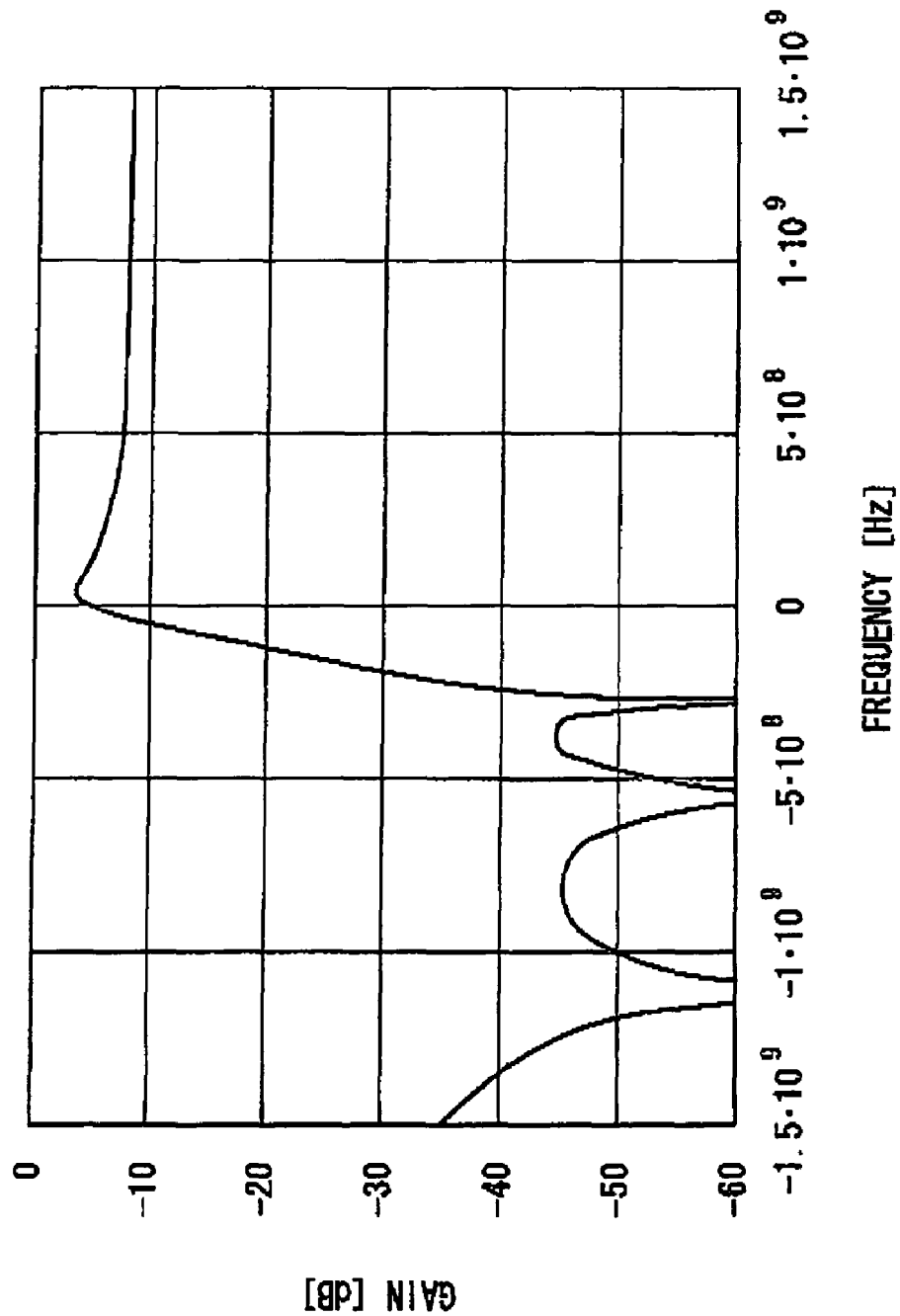
FIG. 12 illustrates the frequency response of a polyphase filter that is shown in FIG. 11.
Figure 19:
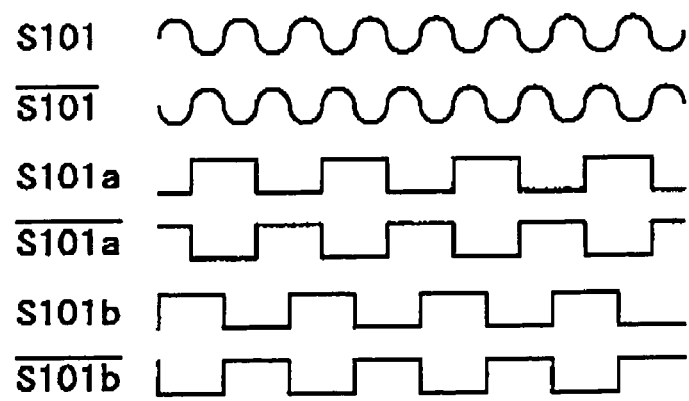
FIG. 19 shows the input/output waveforms of a frequency divider that is shown in FIG. 18.
Figure 20:
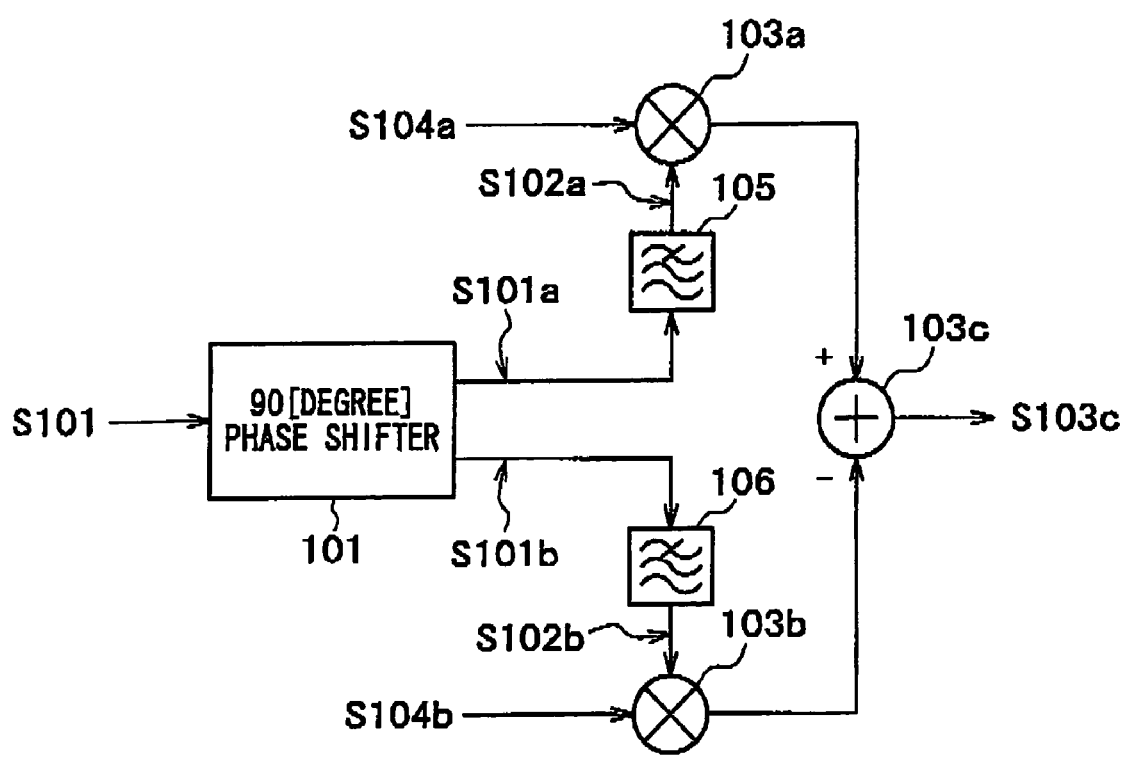
FIG. 20 illustrates the configuration of an image rejection mixer that is formed by positioning lowpass filters between a 90-degree phase shifter and multipliers.

Equation 16 above indicates that the fundamental wave and $(4N+1)$-order harmonic have negative frequencies, and that the $(4N-1)$-order harmonic has a positive frequency. When N=1, the fundamental wave and the third- and fifth-order harmonics result so that the spectrum is as shown in FIG. 10. Outputs S101$a$ and S101$b$ of the 90-degree phase shifter are differential complex signals as indicated in FIG. 19. Therefore, four phases of voltages exist. When these output voltages are properly assigned to I+, Q+, I−, and Q− and applied to the polyphase filter, it is possible to achieve harmonic suppression. When polyphase filters are cascaded to optimally assign their notch frequencies, it is possible to suppress higher-order harmonics. For the optimum assignment method, refer, for instance, to "Phase-Shift Network Analysis optimization" (QEX94) by Kevin Schmidt. FIG. 11 shows a circuit example. FIG. 12 shows its frequency response.

The polyphase filter is structured so that four filter circuits in which a resistor and a capacitor are connected in parallel are cascaded. As represented by FIG. 2, it has a symmetrical structure. Therefore, an unbalanced component contained in the input signal is eliminated at a frequency that agrees with a pole determined by the RC value. This action improves the orthogonality.

Figure 13:
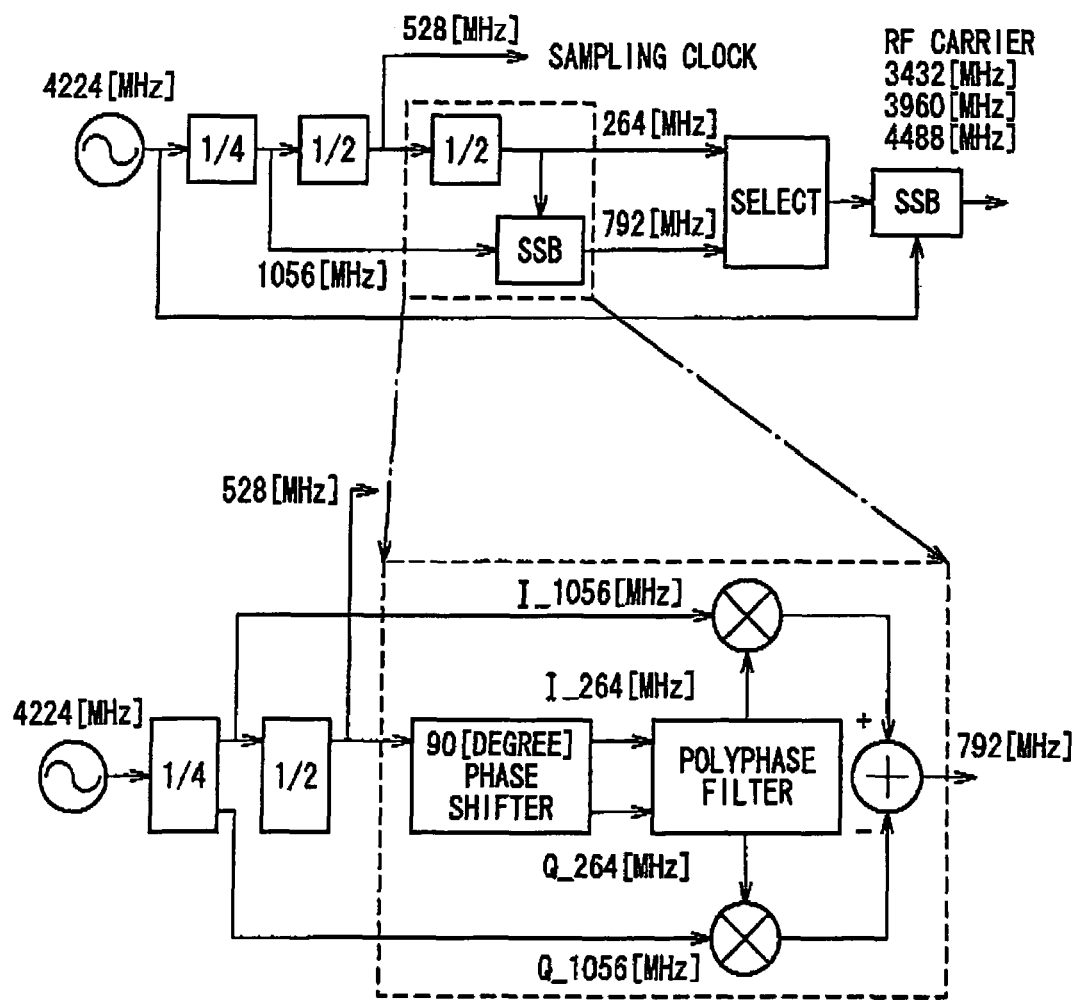
FIG. 13 shows a typical configuration of an image rejection mixer according to the present invention, which is used as a part of a UWB multiband generator.
Figure 16:
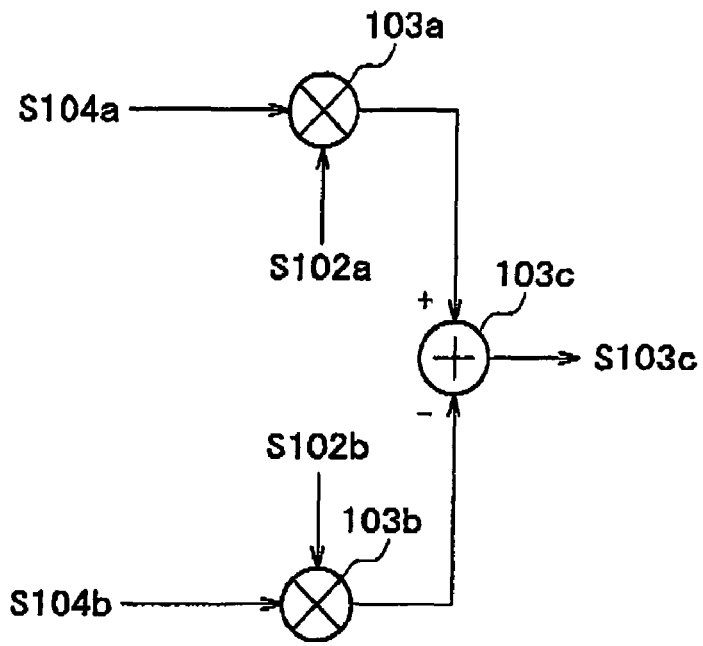
FIG. 16 shows a typical configuration (conventional example) of an image rejection mixer.
Figure 17:
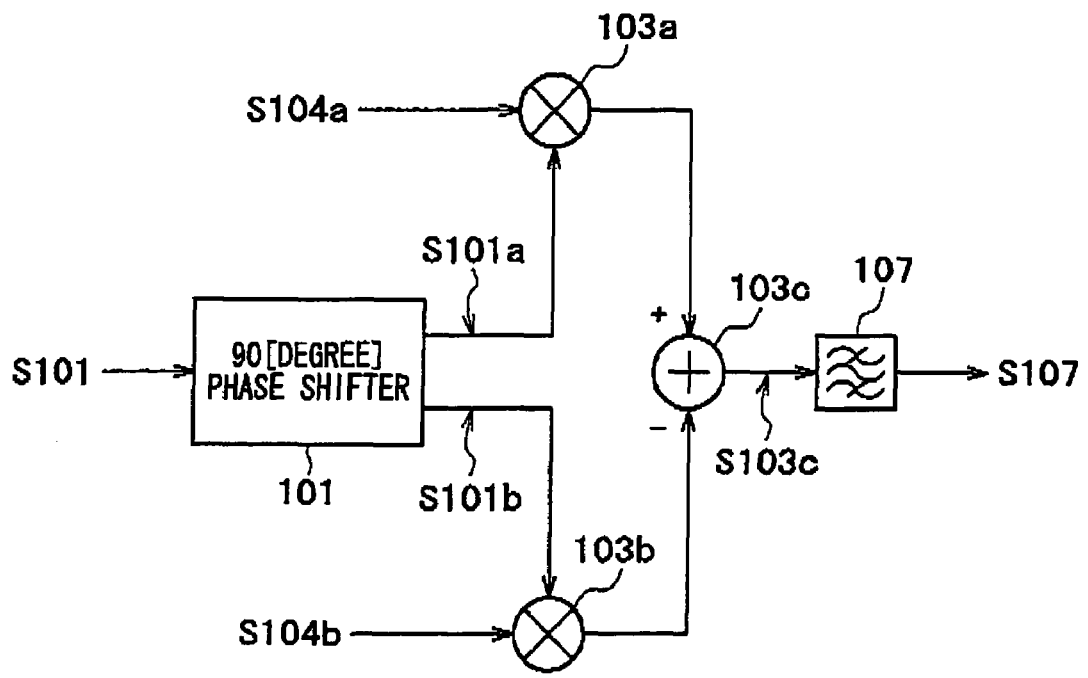
FIG. 17 shows an example in which a frequency divider is used as a 90-degree phase shifter for acquiring orthogonal IF signals.
Figure 18:
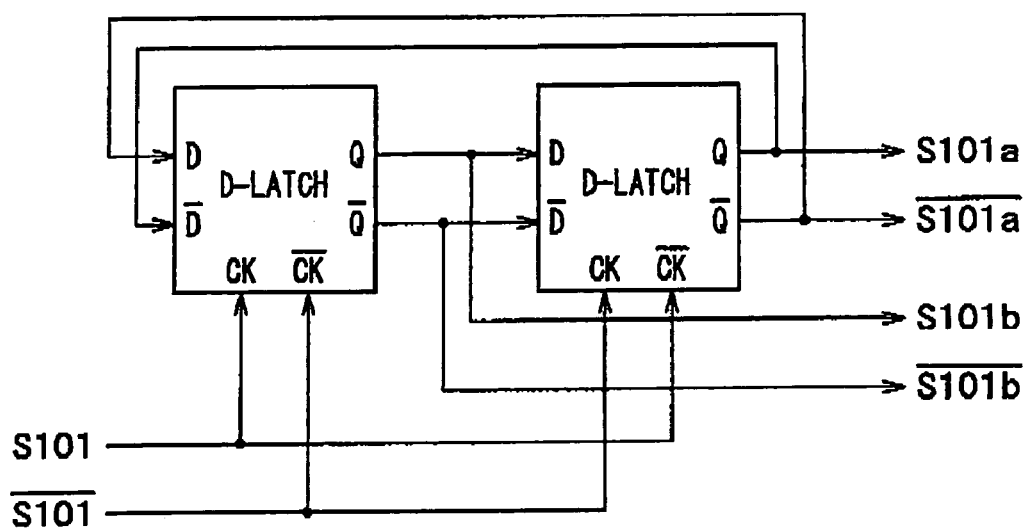
FIG. 18 illustrates the configuration of a master-slave D-latch that is uses a frequency divider circuit.

FIG. 13 shows a typical configuration of an image rejection mixer according to the present invention, which is used as a part of a UWB multiband generator. The upper block diagram in FIG. 13 illustrates the overall frequency configuration of a multiband generator.

A frequency of 4224 MHz, which is supplied from a left-hand oscillator shown in FIG. 13, is divided by four to generate a frequency of 1056 MHz. The resulting frequency further divided by two twice to generate a frequency of 264 MHz. The 90-degree phase shifter not only acquires a pair of complex signals that are 90 degrees out of phase with each other, but also functions as a ½ frequency divider. Further, frequencies of 1056 MHz and 264 MHz are input into a first image rejection mixer to generate a frequency of 792 MHz. A frequency of either 792 MHz or 264 MHz and an oscillator frequency of 4224 MHz are input into a second image rejection mixer to effect frequency conversion (4224−792=3432 [MHz], 4224−264=3960 [MHz], or 4224−792=3432 [MHz]). Consequently, a desired 3-band RF carrier can be generated.

The lower block diagram in FIG. 13 is an enlargement of the first image rejection mixer. Since a ½ frequency divider performs a 90-degree phase shift, a frequency of 264 MHz is a rectangular wave that is phase shifted by 90 degrees. It can be expressed as the sum of a fundamental wave, (4N−1)-order harmonic, and (4N+1)-order harmonic as indicated by Equation 16.

As indicated in FIG. 10, the fundamental wave and (4N+1)-order harmonic have a negative frequency whereas the (4N−1)-order harmonic has a positive frequency. Therefore, only the third-order harmonic can be suppressed, for instance, by allowing the wave to pass through a polyphase filter whose frequency response is illustrated in FIG. 7. If the wave is allowed to pass through a polyphase filter whose frequency response is indicated in FIG. 9, the third- and fifth-order harmonics can be both suppressed.

FIG. 14 shows output spectrums of the multiband generator shown in FIG. 13. The left-hand spectrum illustrates a case where the third- and fifth-order harmonics are suppressed. The central spectrum illustrates a case where only the third-order harmonic is suppressed. The right-hand spectrum illustrates a case where no harmonic is suppressed. The figure indicates that spurious products are successfully reduced.

U.S. Pat. No. 3,559,042, which was mentioned earlier, describes a filter in which polyphase filters that are in phase with each other are cascaded. However, the invention disclosed by such a patent differs from the present invention because the former intends to provide a broadband notch and perform a 90-degree phase shift over a wide band. Further, the present invention is also irrelevant to "A CMOS Dual-Channel, 100-MHz to 1.1 GHz Transmitter for Cable Applications" by A. F. Borremans (IEEE Journal of Solid-State Circuits, Vol. 34, No. 12, December 1999), which describes third-order harmonic component elimination that is performed for a wired communication when a fundamental wave in a certain band collides with a harmonic in another band.

While the present invention has been described in terms of its specific preferred embodiments, those skilled in the art will recognize that the present invention can be practiced with modification within the spirit and scope of the appended claims. The presently preferred embodiments are considered in all respects to be illustrative, and not restrictive. The scope of the present invention is indicated by the appended claims, rather than the foregoing description, and all changes that come within the meaning and range of equivalence thereof are intended to be embraced therein.

What is claimed is:

1. An image rejection mixer for acquiring a third signal, which is a single sideband signal, by subjecting a first pair of complex signals, which are 90 degrees out of phase with each other, and a second pair of complex signals, which are 90 degrees out of phase with each other, to analog multiplication, the image rejection mixer comprising:

harmonic component suppression means for suppressing a (4N+1)-order harmonic component (where N is an integer) that is contained in said first pair of complex signals, which are 90 degrees out of phase with each other, or said second pair of complex signals, which are 90 degrees out of phase with each other, said harmonic component suppression means comprises a polyphase filter that is formed by cascading K pieces of filter circuits in which a resistor and a capacitor are connected in parallel, the filter circuits being +360/K degrees out of phase with a preceding one.

2. The image rejection mixer according to claim 1, wherein the pole frequency fp=1/(2πCR) of said each filter circuit is substantially equal to the frequency of a (4N+1)-order harmonic component.

3. An image rejection mixer for acquiring a third signal, which is a single sideband signal, by subjecting a first pair of complex signals, which are 90 degrees out of phase with each other, and a second pair of complex signals, which are 90 degrees out of phase with each other, to analog multiplication, the image rejection mixer comprising:

harmonic component suppression means for suppressing a (4N−1)-order harmonic component (where N is an integer) that is contained in said first pair of complex signals, which are 90 degrees out of phase with each other, or said second pair of complex signals, which are 90 degrees out of phase with each other, said harmonic component suppression means comprises a polyphase filter that is formed by cascading K pieces of filter circuits in which a resistor and a capacitor are connected in parallel, the filter circuits being −360/K degrees out of phase with a preceding one.

4. The image rejection mixer according to claim 3, wherein the pole frequency fp=1/(2πCR) of said each filter circuit is substantially equal to the frequency of a (4N−1)-order harmonic component.

5. An image rejection mixer for acquiring a third signal, which is a single sideband signal, by subjecting a first pair of complex signals, which are 90 degrees out of phase with each other, and a second pair of complex signals, which are 90 degrees out of phase with each other, to analog multiplication, the image rejection mixer comprising:

first harmonic component suppression means for suppressing a (4N+1)-order harmonic component (where N is an integer) that is contained in said first pair of complex signals, which are 90 degrees out of phase with each other, or said second pair of complex signals, which are 90 degrees out of phase with each other; and second harmonic component suppression means for suppressing a (4N−1)-order harmonic component (where N is an integer) that is contained in said first pair of complex signals, which are 90 degrees out of phase with each other, or said second pair of complex signals, which are 90 degrees out of phase with each other, wherein said first harmonic component suppression means and said second harmonic component suppression means are cascaded, and said first harmonic component suppression means comprises a polyphase filter that is formed by cascading K pieces of filter circuits in which a resistor and a capacitor are connected in parallel, the filter circuits being +360/K degrees out of phase with a preceding one; and said second harmonic component suppression means comprises a polyphase filter that is formed by cascading K pieces of filter circuits in which a resistor and a capacitor are connected in parallel, the filter circuits being −360/K degrees out of phase with a preceding one.

6. The image rejection mixer according to claim 5, wherein the pole frequency fp=1/(2πCR) of said each filter circuit is substantially equal to the frequency of a (4N+1)-order harmonic component; and wherein the pole frequency fp=1/(2πCR) of said each filter circuit is substantially equal to the frequency of a (4N−1)-order harmonic component.

7. A multiband generator for generating a plurality of frequency band components, the multiband generator comprising:
- an oscillator for generating a basic frequency signal;
- one or more frequency dividers for frequency-dividing said basic frequency signal or its frequency-divided frequency signal;
- phase shift means for acquiring a pair of complex signals, which are 90 degrees out of phase with each other, from said basic frequency signal or said frequency-divided frequency signal; and
- harmonic component suppression means for suppressing a (4N+1)-order and/or (4N−1)-order harmonic component (where N is an integer) that is contained in the pair of complex signals when a pair of complex signals of said basic frequency signal or said frequency-divided frequency signal are subjected to analog multiplication, wherein said harmonic component suppression means comprises a positive-phase polyphase filter that is formed by cascading K pieces of filter circuits in which a resistor and a capacitor are connected in parallel; wherein the filter circuits are +360/K degrees out of phase with a preceding one; and wherein the pole frequency fp=1/(2pCR) of said each filter circuit is substantially equal to the frequency of a (4N+1)-order harmonic component.

8. The multiband generator according to claim 7, wherein said harmonic component suppression means comprises a
- negative-phase polyphase filter that is formed by cascading K pieces of filter circuits in which a resistor and a capacitor are connected in parallel; wherein
- the filter circuits are −360/K degrees out of phase with a preceding one; and wherein
- the pole frequency fp=1/(2pCR) of said each filter circuit is substantially equal to the frequency of a (4N−1)-order harmonic component.

9. A cascaded polyphase filter comprising:
- a positive-phase polyphase filter that is formed by cascading K pieces of filter circuits, which comprise a resistor and a capacitor and are +360/K degrees out of phase with a preceding one; and
- a negative-phase polyphase filter that is formed by cascading K pieces of filter circuits, which comprise a resistor and a capacitor and are −360/K degrees out of phase with a preceding one, wherein
- said positive-phase polyphase filter and said negative-phase polyphase filter are cascaded.

\* \* \* \* \*